(12) United States Patent
Kamada et al.

(10) Patent No.: US 7,976,732 B2
(45) Date of Patent: Jul. 12, 2011

(54) ELECTROCONDUCTIVE COMPOSITION AND ELECTROCONDUCTIVE FILM FORMING METHOD

(75) Inventors: Keiji Kamada, Ehime (JP); Kensaku Mori, Ehime (JP)

(73) Assignee: Sumitomo Metal Mining Co., Ltd., Tokyo (JP)

( * ) Notice: Subject to any disclaimer, the term of this patent is extended or adjusted under 35 U.S.C. 154(b) by 1056 days.

(21) Appl. No.: 11/727,251

(22) Filed: Mar. 26, 2007

(65) Prior Publication Data

US 2008/0014359 A1 Jan. 17, 2008

(30) Foreign Application Priority Data

Mar. 27, 2006 (JP) .................................. 2006-084427

(51) Int. Cl.
*H01B 1/00* (2006.01)
(52) U.S. Cl. ..... 252/512; 427/98.4; 427/123; 427/383.1
(58) Field of Classification Search .................. 252/500, 252/512, 514, 518.1, 783; 75/247; 427/98.4, 427/123, 383.1
See application file for complete search history.

(56) References Cited

U.S. PATENT DOCUMENTS

| | | | | |
|---|---|---|---|---|
| 4,921,623 A | * | 5/1990 | Yamaguchi et al. | 252/512 |
| 5,418,193 A | * | 5/1995 | Tani et al. | 501/19 |
| 5,807,508 A | * | 9/1998 | Kawahara et al. | 252/512 |
| 5,976,628 A | * | 11/1999 | Kawahara et al. | 427/383.1 |
| 6,379,745 B1 | * | 4/2002 | Kydd et al. | 427/98.4 |
| 7,081,214 B2 | * | 7/2006 | Matsuba et al. | 252/512 |
| 7,262,511 B2 | * | 8/2007 | Osako et al. | 257/783 |
| 2003/0038280 A1 | * | 2/2003 | Kojo et al. | 252/514 |
| 2003/0180451 A1 | * | 9/2003 | Kodas et al. | 427/123 |
| 2004/0004209 A1 | * | 1/2004 | Matsuba et al. | 252/518.1 |
| 2004/0151893 A1 | | 8/2004 | Kydd et al. | |
| 2005/0230667 A1 | * | 10/2005 | Komagata et al. | 252/500 |
| 2006/0043346 A1 | * | 3/2006 | Kodas et al. | 252/514 |
| 2007/0131912 A1 | * | 6/2007 | Simone et al. | 252/500 |
| 2007/0185243 A1 | * | 8/2007 | Terada et al. | 523/457 |
| 2008/0014359 A1 | * | 1/2008 | Kamada et al. | 427/383.1 |
| 2008/0148904 A1 | * | 6/2008 | Tomonari et al. | 75/247 |

FOREIGN PATENT DOCUMENTS

| | | | |
|---|---|---|---|
| JP | 06-215617 | * | 8/1994 |
| JP | 7320535 | | 12/1995 |
| JP | 09-198920 | * | 7/1997 |
| JP | 10-233119 | * | 9/1998 |
| JP | 10-312712 | * | 11/1998 |
| JP | 2004256757 | | 9/2004 |
| JP | 2004327229 | | 11/2004 |
| JP | 2004534362 | | 11/2004 |
| JP | 2005-093741 | * | 4/2005 |

* cited by examiner

*Primary Examiner* — Randy Gulakowski
*Assistant Examiner* — Khanh Tuan Nguyen
(74) *Attorney, Agent, or Firm* — Dykema Gossett PLLC

(57) ABSTRACT

An electroconductive composition including a mixture of a copper powder having an averaged particle size between 0.3 and 20 μm and a copper fine powder having an averaged particle size between 1 and 50 nm; a solvent comprising a multivalent alcohol, such as ethylene glycol or diethylene glycol, having two or more OH groups; and an additive comprising a compound such as malic acid or citric acid having two or more COOH groups and one or more OH groups where the number of COOH groups is equal to or greater than the number of OH groups.

10 Claims, No Drawings

ELECTROCONDUCTIVE COMPOSITION AND ELECTROCONDUCTIVE FILM FORMING METHOD

BACKGROUND OF THE INVENTION

1. Field of the Invention

The present invention relates to an electroconductive composition to be used for forming electroconductive films of various electronic components and the like, and a method for forming an electroconductive film by adopting such an electroconductive composition.

2. Description of Relevant Art

In various electronic components and the like, there is formed a pattern of an electroconductive composition by using a technique such as screen printing, which pattern is calcined at a low temperature to form a thick-film electroconductive circuit having a low resistance. Typical methods for forming thick-film electroconductive circuits are generally classified into subtractive methods and additive methods, and the additive methods have advantages over the subtractive methods in terms of readiness, cost, and the like of process, and environment loads due to wastes.

Examples of characteristics typically required for electroconductive compositions to be used in additive methods include readiness of formation of electroconductive circuits, lower specific resistances of electroconductive films to be obtained, excellent close contact properties between electroconductive films and substrates, and the like. Used for such electroconductive compositions are metal particles such as made of gold, silver, copper, palladium, platinum, or the like, as electroconductive fillers, and electroconductive compositions including silver as electroconductive fillers are particularly frequently used. However, the electroconductive compositions adopting silver fillers are defective in that migration is apt to occur.

Concerning restriction of migration, it is effective to employ copper as a filler, which is also excellent in terms of electroconductive characteristics, cost, and the like. As a method for forming an electroconductive film by adopting copper as a filler, attention has been recently and particularly directed to a technique for realizing low-temperature calcining by adopting copper particles having an averaged particle size of 100 nm or less. For example, in JP-A-2004-256757 and JP-A-2004-327229, there is disclosed a method for forming an electroconductive circuit, by adopting an electroconductive ink containing a copper powder having particle sizes of 30 nm or less, and drawing an electroconductive pattern by an ink jet scheme, followed by heating at a temperature of 200° C. or lower in a nitrogen atmosphere.

However, it is required to repeat drawing and calcining in order to form a circuit having a film thickness at a level of about several μm by the ink jet scheme, thereby exhibiting a disadvantage of complicated process. Further, the above-described method is said to enable adoption of fine particulates of copper and obtainment of electroconductivity by low-temperature calcining by virtue of addition of a dispersant such as citrate like ammonium citrate, or a tertiary amine type monomer. However, electroconductive films obtained thereby have specific resistances which are 20 to 50 times as high as those of bulk copper, thereby failing to attain a sufficiently satisfactory level.

As means for overcoming such defects, disclosed in JP-A-7-320535 is a method for forming a thick-film electroconductive circuit having a film thickness of several μm or more by adopting a screen printing scheme, a dispenser scheme, and the like. This method is described to produce fine metal particles having an averaged particle size of 100 nm or less by adopting an organic metal salt as a precursor, and to bring the fine particles into a mixture with copper-based particles having an averaged particle size of 0.2 μm or more, thereby enabling obtainment of a low specific resistance which is two or less times that of bulk copper.

However, in the method, it is required to form the fine particles having an averaged particle size of 100 nm or less, by adopting the organic metal salt such as carboxylate as the precursor, and by once heating it. Further, the calcining condition of the electroconductive composition includes a temperature as extremely high as about 900° C. in a nitrogen atmosphere, and the sintering start temperature is also as high as about 400° C., thereby exhibiting such a defect that the method is inapplicable to a polymer substrate, for example, and is limited to usage such as formation of a circuit on a substrate like a ceramic substrate having a higher heat-resistance temperature.

In turn, disclosed in JP-A-2004-534362 as a technique for lowering a calcining temperature is a method for forming a thick-film electroconductive circuit by a composition comprising: copper fine particles having an averaged particle size of 0.3 μm or less, and copper particles having an averaged particle size of 0.3 μm or more; and a reactive compound such as a decomposable organocopper compound for depositing metal copper by thermal decomposition, or carboxylic acid capable of producing such a decomposable organocopper compound. It is also disclosed therein to bring the particles having the averaged particle size of 0.3 μm into a mixture with particles having a different averaged particle size. According to this method, it is described that the decomposable organocopper compound is decomposed to produce copper during heating, and a low resistance which is about 3 times that of bulk copper can be realized by calcining at 330° C.

However, the above method requires a specific mixed gas of nitrogen-steam-hydrogen as a calcining ambient, thereby exhibiting problems of safety, economical efficiency, and the like. Moreover, since the calcining temperature is also as high as about 330° C., the method is difficult in application to a polymer substrate such as a polyimide substrate having a heat-resistance temperature of 300° C. or lower, for example. It is thus required to attain calcining at a lower temperature, for easy application to a polymer substrate.

As described above, electroconductive compositions including copper as fillers have not reached a position of mainstream of electroconductive compositions, due to such reasons that copper essentially and internally has a problem of degradation due to oxidation, and high temperatures are required for calcining copper, and so on. As such, there is sought for an electroconductive composition that is easy in formation of electroconductive circuit, that provides an electroconductive film having a low specific resistance of about 5 μΩ·cm which is about 3 times that of bulk copper, that is not limited in kind of substrate and has an excellent close contact property with a substrate, and that is low in cost.

Incidentally, in addition to the above demand to obtain an electroconductive circuit having a low resistance by adopting an electroconductive composition including copper as filler, there is also a demand for an electroconductive composition that can be calcined in the industrially and easily achievable atmospheric air, and that is capable of providing an electroconductive film having a resistance value within an allowable range as an electronic component such as a specific resistance of about 100 μΩ·cm which is about 60 times that of bulk copper, for example.

Namely, copper is considerably deteriorated in performance due to oxidation such that calcining is necessarily conducted in an inert atmosphere or a reducing atmosphere, so that copper is limited in applicability insofar as in a present state. Thus, if there is provided an electroconductive composition capable of forming an electroconductive film having a specific resistance within a certain allowable range even by calcining in the atmospheric air, such an electroconductive composition is capable of substituting for conventional ones required to be calcined in an inert atmosphere or reducing atmosphere in many applications where such a specific resistance is not problematic.

SUMMARY OF THE INVENTION

In view of the above circumstances of the related art, it is therefore an object of the present invention to provide: an electroconductive composition that can be calcining at a low temperature not only in an inert atmosphere but also in the atmospheric air without going through complicated process, that is capable of preventing oxidation of copper particles as fillers, that exhibits an excellent electroconductivity, and that is low in cost; and a method for forming an electroconductive film in an inert atmosphere or in the atmospheric air by adopting such an electroconductive composition.

The present inventors have earnestly conducted investigation so as to solve the above problem, and found that an electroconductive composition exhibits a higher antioxidative effect in calcining at 200° C. or lower in the atmospheric air and exhibits an excellent electroconductivity comparable to that of bulk copper by calcining at 300° C. or lower in an inert atmosphere, by combining copper particles having different averaged particle sizes and duly preparing a solvent and an additive for the electroconductive composition, thereby narrowly carrying out the present invention.

Namely, the present invention provides an electroconductive composition including a metal powder, a solvent, and an additive;

wherein the metal powder is a mixture of a copper powder having an averaged particle size between 0.3 and 20 µm and a copper fine powder having an averaged particle size between 1 and 50 nm;

wherein the solvent is a multivalent alcohol having two or more OH groups; and wherein the additive is a compound having two or more COOH groups and one or more OH groups where the number of COOH groups is equal to or greater than the number of OH groups.

In the electroconductive composition of the present invention, it is desirable that the metal powder is a mixture at a ratio of 1 to 100 parts by weight of the copper fine powder relative to 100 parts by weight of the copper powder. Further, it is desirable that the solvent is mixed at a ratio of 5 to 35 parts by weight with 100 parts by weight of the metal powder. Furthermore, it is desirable that the additive is mixed at a ratio of 1 to 15 parts by weight with 100 parts by weight of the metal powder.

In the electroconductive composition of the present invention, it is desirable that the solvent comprises at least one kind selected from ethylene glycol, diethylene glycol, triethylene glycol, tetraethylene glycol, and glycerin. Further, it is desirable that the additive comprises at least one kind selected from malic acid, citric acid, and tartaric acid.

The present invention also provides an electroconductive film forming method comprising the steps of: adopting any one of the above described electroconductive compositions of the present invention; coating the electroconductive composition onto a substrate; and heat treating the electroconductive composition. Concretely, the present invention provides an electroconductive film forming method wherein the heat treating step comprises the step of: heating and calcining the electroconductive composition at a temperature between 200 and 300° C. in an inert atmosphere, or an electroconductive film forming method wherein the heat treating step comprises the step of: heating and calcining the electroconductive composition at a temperature between 150 and 200° C. in the atmospheric air.

According to the present invention, there can be provided an electroconductive composition that is inexpensive by adopting copper particles as an electroconductive filler, that can be calcined at a low temperature not only in an inert atmosphere but also in the atmospheric air without going through complicated process, and that is capable of forming an electroconductive film having an excellent electroconductivity while preventing oxidation of copper particles.

Thus, adoption of the electroconductive composition enables formation of: an electroconductive film having a specific resistance of 10 µΩ·cm or less which is about 6 times that of bulk copper, by calcining at 300° C. or lower in an inert atmosphere, without using a reducing gas such as an unusual hydrogen gas; and an electroconductive film having a specific resistance of 5 µΩ·cm or less which is about 3 times that of bulk copper, by appropriately designing the conditions. It is further possible to form an electroconductive film having a specific resistance of about 100 µΩ·cm which is about 60 times that of bulk copper, by calcining at 200° C. or lower in the atmospheric air.

DETAILED DESCRIPTION OF THE PREFERRED EMBODIMENTS

In an electroconductive composition of the present invention, there are simultaneously used a copper powder having an averaged particle size between 0.3 and 20 µm and a copper fine powder having an averaged particle size between 1 and 50 nm, as a metal powder acting as an electroconductive filler. Averaged particle sizes less than 0.3 µm of the copper powder lead to numerous voids after calcining to thereby fail to obtain an electroconductive film having a low specific resistance, while averaged particle sizes exceeding 20 µm make it difficult to form a fine pattern. Meanwhile, averaged particle sizes less than 1 nm of the copper fine powder lead to considerable aggregation of fine particles thereby making it difficult to disperse the fine particles within the composition, while averaged particle sizes exceeding 50 nm lead to an insufficient effect of contacting with the copper powder and to failure of enjoyment of an effect by low-temperature sintering.

The mixing ratio between the copper powder having averaged particle size between 0.3 and 20 µm and the copper fine powder having an averaged particle size between 1 and 50 nm is preferably within a range of 1 to 100 parts by weight of the copper fine powder relative to 100 parts by weight of the copper powder. Mixing ratios less than 1 part by weight of the copper fine powder relative to 100 parts by weight of the copper powder lead to insufficient effects of contacting with the copper powder, while mixing ratios exceeding 100 parts by weight of the copper fine powder lead to considerable deterioration due to oxidation in the atmospheric air to disadvantageously lead to a higher specific resistance of an electroconductive film after calcining.

In the electroconductive composition of the present invention, there are used: a multivalent alcohol having two or more OH groups, as a solvent for dispersing therein the metal powder comprising the copper powder and copper fine powder; and a compound having two or more COOH groups and one or more OH groups where the number of COOH groups is equal to or greater than the number of OH groups, as an additive. This additive exhibits absorptivity onto surfaces of metal powder particles by virtue of the OH groups, and simultaneously therewith, dissolves oxides formed on surfaces of the copper powder particles by virtue of function of included COOH groups the number of which is larger than that of OH groups, thereby establishing a surface state exhibiting an excellent electroconductivity. Further, part of copper carboxylate formed then adsorbs onto surfaces of metal powder particles, thereby keeping a state exhibiting an excellent electroconductivity.

Note that when the compound having two or more COOH groups and one or more OH groups where the number of COOH groups is equal to or greater than the number of OH groups, is added in a state of salt such as ammonium salt, the compound exhibits an effect to be adsorbed onto surfaces of metal powder particles, but fails to obtain a sufficient electroconductivity because the effect for dissolving oxides on the surfaces is insufficient then. It is thus important that the compound is to be added, not as a salt, but as an acid having two or more COOH groups.

Further, the additive has a function to cure the composition by heating. Namely, part of the compound having two or more COOH groups and one or more OH groups where the number of COOH groups is equal to or greater than the number of OH groups, polymerizes with the multivalent alcohol having two or more OH groups added as the solvent, by heating and calcining at a relatively low temperature upon formation of the electroconductive film, to thereby form a polymer which in turn cures the composition.

The formation of such a polymer leads to formation of an electroconductive film having a sufficient strength and an excellent close contact property with a substrate. Further, metal powder particles are sufficiently contacted with one another within the obtained electroconductive film by virtue of an adhering effect of the polymer, while expressing an effect for remarkably lowering a specific resistance, cooperatively with the above described excellent surface state. Furthermore, the formed polymer restricts invasion of oxygen, thereby restricting oxidation of metal powder particles within the electroconductive film. These effects are extremely effective for a copper fine powder having an averaged particle size of 50 nm or less exhibiting a particularly high surface activity, in a manner that copper fine powder particles having surfaces free of oxide layers promote strong contact among larger copper powder particles, thereby expressing superior electroconductive characteristics.

Meanwhile, with the antioxidative effect kept, higher temperatures upon heating and calcining, for example, temperatures at 200° C. or higher of calcining in an inert atmosphere, cause progress of sintering between copper fine powder particles or sintering between copper fine powder particles and copper powder particles, thereby expressing more excellent electroconductive characteristics. Namely, in the course of such temperature elevation, part of the polymer formed at a low temperature is decomposed, and simultaneously therewith, deposition of metal copper is caused by virtue of decomposition of copper carboxylate at surfaces of the metal powder particles and at contacting portions thereof, thereby realizing strong sintering between metal powder particles exhibiting an excellent electroconductivity. Further, part of the polymer is left on a substrate surface, and functions as a strong binder between the substrate and the electroconductive film, thereby keeping an extremely high close contact property of the film with the substrate.

Additives to be adopted in the present invention are usable without any limitations insofar as they are compounds each having two or more COOH groups and one or more OH groups where the number of COOH groups is equal to or greater than the number of OH groups. However, since additives are each to be desirably high in solubility in the solvent, malic acid, citric acid, and tartaric acid are desirable, and malic acid and citric acid are more desirable. As the additive, one kind or two or more kinds of these compounds may be selected and added/mixed into an electroconductive composition.

The composition ratio of the additive in the electroconductive composition is preferably 1 to 15 parts by weight, and more preferably 5 to 10 parts by weight relative to 100 parts by weight of the metal powder. Composition ratios of the additive less than 1 part by weight, not only fail to achieve sufficient formation of the polymer by virtue of polymerization of the additive with the solvent, but also fail to obtain a sufficient effect for eliminating oxides at surfaces of copper powder particles. Further, composition ratios of the additive exceeding 15 parts by weight lead to considerably higher viscosities of the composition thereby complicating handling thereof.

Solvents to be adopted in the present invention will do insofar as they are each a multivalent alcohol having two or more OH groups, and such an alcohol is then capable of polymerizing with the additive by heating to form a polymer. Only, it is desirable that excessive solvents vaporize at low temperatures, in order that the electroconductive film will exhibit an excellent electroconductivity. In consideration of these points, desirably usable as the solvent is one kind or two or more kinds of ethylene glycol, diethylene glycol, triethylene glycol, tetraethylene glycol, and glycerin, and ethylene glycol is particularly desirable.

The composition ratio of the solvent in the electroconductive composition is preferably 5 to 35 parts by weight, and more preferably 10 to 25 parts by weight relative to 100 parts by weight of the metal powder. Composition ratios of the solvent less than 5 parts by weight fail to achieve sufficient formation of polymer, and lead to considerably increased viscosities of the composition, thereby complicating handling thereof. Composition ratios of the solvent exceeding 35 parts by weight lead to excessive amounts of residual solvent in the electroconductive film after calcining, thereby not only increasing a specific resistance but also lowering a strength of the electroconductive film, so that a due pattern can not be kept.

The electroconductive composition of the present invention can be mixed with a polar solvent, depending on usage of the former. Then desirable as the polar solvent are water, alcohols such as methanol and ethanol, and carbitols, and one kind or two or more kinds thereof are usable. Further, the electroconductive composition of the present invention can be selected in terms of composition and components, depending on film thickness, electrical conductivity of an intended electroconductive film, calcining conditions, and the like.

For example, when it is desired to form an electroconductive film by calcining at 200° C. or lower in the atmospheric air, it is preferable to restrict a ratio of a copper fine powder while increasing particle sizes of a copper powder, in order to restrict deterioration of copper due to oxidation to a minimal extent. Meanwhile, when it is desired to obtain an electroconductive film having a low specific resistance by calcining in an inert atmosphere, it is preferable to increase particle sizes of a copper powder and decrease particle sizes of a copper fine powder, depending on a film thickness of the electroconductive film. At this time, for the purpose of increasing a filling ratio of copper particles within the electroconductive film, it is also effective to use the copper powder of 0.3 µm or more prepared by mutually mixing particles having different averaged particle sizes.

The above-described electroconductive composition of the present invention is coated onto a substrate, followed by heat treatment in an inert atmosphere or in the atmospheric air, thereby enabling formation of an electroconductive film. Calcining temperatures for heating and calcining in an inert atmosphere are desirably 200 to 300° C., and more desirably 250 to 300° C. Calcining in an inert atmosphere at temperatures exceeding 300° C. will not cause particular problems in terms of an electroconductive film, but it is then impossible to adopt, a polymer substrate which is inferior in heat resistance, as a substrate. Further, calcining temperatures lower than 200° C. disadvantageously lead to insufficiently lowered specific resistances of the electroconductive film after calcining.

The electroconductive composition of the present invention is desirably heated and calcined at temperatures of 150 to 200° C. in the atmospheric air. Heating and calcining at temperatures exceeding 200° C. in the atmospheric air lead to considerable deterioration of the metal powder due to oxidation, thereby increasing a specific resistance of the obtained electroconductive film. Further, calcining temperatures below 150° C. in the atmospheric air disadvantageously lead to not only insufficiently lowered specific resistances of the electroconductive film but also deteriorated strengths of the electroconductive film.

The above-described electroconductive film obtained by calcining at 200 to 300° C. in an inert atmosphere allows for achievement of a specific resistance of 10 µΩ·cm or less which is about 6 times that of bulk copper, and a much lower specific resistance of 5 µΩ·cm or less which is about 3 times that of bulk copper by appropriately designing the conditions. Further, in case of calcining at 200° C. or lower in the atmospheric air, it is possible to form an electroconductive film having a specific resistance of about 100 µΩ·cm which is about 60 times that of bulk copper.

EXAMPLES

Example 1

20 parts by weight of a copper fine powder having an averaged particle size of 50 nm prepared by a wet reducing method was mixed with 80 parts by weight of a copper powder (UCP030 produced by SUMITOMO METAL MINING CO., LTD.) having an averaged particle size of 0.4 µm, thereby preparing a mixed copper powder. Added to 100 parts by weight of this mixed copper powder was 19 parts by weight of ethylene glycol as a solvent and 6 parts by weight of citric acid as an additive, followed by kneading by a high speed planetary movement type deaerating/kneading device (NBK-1, manufactured by NIHONSEIKI KAISHA LTD.), thereby preparing an electroconductive composition of a sample 1.

The obtained electroconductive composition of the sample 1 was coated onto a slide glass substrate into a film thickness of about 20 µm by a metal squeegee to thereby form a pattern of 12×40 mm, followed by calcining at 300° C. for an hour in a nitrogen atmosphere furnace, thereby forming an electroconductive film.

The obtained electroconductive film of the sample 1 was measured in terms of sheet resistance value by a four-end needle method by a low specific resistance meter (Loresta-GP MCP-T600 manufactured by Mitsubishi Chemical Corporation) and in terms of film thickness by a surface roughness shape meter (SURFCOM 130A manufactured by Tokyo Seimitsu Co., Ltd.), thereby calculating a volume resistivity. As a result, the electroconductive film of the sample 1 had a volume resistivity of 3.44 µΩ·cm.

The electroconductive film of the sample 1 was also checked for a close contact strength to a substrate, by an X-cut tape method prescribed in JIS K5400. As a result, it was confirmed that the electroconductive film was closely contacted strongly to a glass substrate, without peeled by tapes (corresponding to 10 points in JIS evaluation score).

Example 2

There was formed an electroconductive film of a sample 2 in the same manner as Example 1, except that: 90 parts by weight of the copper powder having an averaged particle size of 0.4 µm and 10 parts by weight of the copper fine powder having an averaged particle size of 50 nm were mixed with each other; and 15 parts by weight of ethylene glycol as a solvent and 10 parts by weight of citric acid as an additive were mixed into 100 parts by weight of this mixed copper powder.

The obtained electroconductive film of the sample 2 was evaluated in the same manner as Example 1, and as a result thereof, it had a volume resistivity of 3.71 µΩ·cm and a close contact property of 10 points in JIS evaluation score.

Example 3

There was formed an electroconductive film of a sample 3 in the same manner as Example 2, except that malic acid was adopted as an additive such that its weight was changed to 6 parts by weight (molar amount equal to that of citric acid in Example 2) in consideration of a difference of molecular weight, and 19 parts by weight of ethylene glycol as a solvent was used relative to 100 parts by weight of the mixed copper powder in order to match the ratio of the solvent with that of the metal powder in the composition.

The obtained electroconductive film of the sample 3 was evaluated in the same manner as Example 1, and as a result thereof, it had a volume resistivity of 4.55 µΩ·cm and a close contact property of 10 points in JIS evaluation score.

Example 4

There was formed an electroconductive film of a sample 4 in the same manner as Example 2, except that tartaric acid (L-tartaric acid) was adopted as an additive such that its weight was changed to 7 parts by weight (molar amount equal to that of citric acid in Example 2) in consideration of a difference of molecular weight, and 18 parts by weight of ethylene glycol as a solvent was used relative to 100 parts by weight of the mixed copper powder in order to match the ratio of the solvent with that of the metal powder in the composition.

The obtained electroconductive film of the sample 4 was evaluated in the same manner as Example 1, and as a result thereof, it had a volume resistivity of 9.05 µΩ·cm and a close contact property of 10 points in JIS evaluation score.

Comparative Example 1

There was formed an electroconductive film of a sample 5 in the same manner as Example 2, except that lactic acid was adopted as an additive such that its weight was changed to 4 parts by weight (molar amount equal to that of citric acid in Example 2) in consideration of a difference of molecular weight, and 21 parts by weight of ethylene glycol as a solvent was used relative to 100 parts by weight of the mixed copper powder in order to match the ratio of the solvent with that of the metal powder in the composition.

The obtained electroconductive film of the sample was evaluated in the same manner as Example 1, and as a result thereof, it had a volume resistivity of 42.2 μΩ·cm, and a close contact property was such that part of the electroconductive film was peeled from a glass substrate by tapes (corresponding to 2 points in JIS evaluation score).

Comparative Example 2

There was formed an electroconductive film of a sample 6 in the same manner as Example 2, except that succinic acid was adopted as an additive such that its weight was changed to 5 parts by weight (molar amount equal to that of citric acid in Example 2) in consideration of a difference of molecular weight, and 20 parts by weight of ethylene glycol as a solvent was used relative to 100 parts by weight of the mixed copper powder in order to match the ratio of the solvent with that of the metal powder in the composition.

The obtained electroconductive film of the sample 6 was evaluated in the same manner as Example 1, and as a result thereof, it had a volume resistivity of 181 μΩ·cm, and a close contact property of 10 points in JIS evaluation score similarly to the sample 2 of Example 2.

Comparative Example 3

There was formed an electroconductive film of a sample 7 in the same manner as Example 2, except that acetic acid was adopted as an additive such that its weight was changed to 3 parts by weight (molar amount equal to that of citric acid in Example 2) in consideration of a difference of molecular weight, and 22 parts by weight of ethylene glycol as a solvent was used relative to 100 parts by weight of the mixed copper powder in order to match the ratio of the solvent with that of the metal powder in the composition.

The obtained electroconductive film of the sample 7 was evaluated in the same manner as Example 1, and as a result thereof, it had a volume resistivity of 110 μΩ·cm, and a close contact property was such that the whole of the electroconductive film was peeled from a glass substrate by tapes (corresponding to 0 point in JIS evaluation score).

Comparative Example 4

There was formed an electroconductive film of a sample 8 in the same manner as Example 2, except that formic acid was adopted as an additive such that its weight was changed to 2 parts by weight (molar amount equal to that of citric acid in Example 2) in consideration of a difference of molecular weight, and 23 parts by weight of ethylene glycol as a solvent was used relative to 100 parts by weight of the mixed copper powder in order to match the ratio of the solvent with that of the metal powder in the composition.

The obtained electroconductive film of the sample 8 was evaluated in the same manner as Example 1, and as a result thereof, it had a volume resistivity of 490 μΩ·cm, and a close contact property was such that the whole of the electroconductive film was peeled from a glass substrate by tapes (corresponding to 0 point in JIS evaluation score).

Table 1 shows compositions of the electroconductive compositions according to the samples 1 to 4 of Examples and samples 5 to 8 of Comparative Examples, and Table 2 shows calcining conditions for the electroconductive compositions and evaluation results of the obtained electroconductive films.

TABLE 1

| Sample | Metal powder (parts by weight) | | Ethylene glycol (parts by weight) | Additive | |
|---|---|---|---|---|---|
| | Copper powder | Copper fine powder | | Type | Parts by weight |
| 1 | 80 | 20 | 19 | Citric acid | 6 |
| 2 | 90 | 10 | 15 | Citric acid | 10 |
| 3 | 90 | 10 | 19 | Malic acid | 6 |
| 4 | 90 | 10 | 18 | Tartaric acid | 7 |
| 5* | 90 | 10 | 21 | Lactic acid | 4 |
| 6* | 90 | 10 | 20 | Succinic acid | 5 |
| 7* | 90 | 10 | 22 | Acetic acid | 3 |
| 8* | 90 | 10 | 23 | Formic acid | 2 |

Note:
Samples marked with "*" in Table are comparative examples.

TABLE 2

| Sample | Calcining conditions | | | Specific resistance of electroconductive film (μΩ·cm) | Close contact property of electroconductive film (JIS evaluation score) |
|---|---|---|---|---|---|
| | Atmosphere | Temperature (°C.) | Time (minute) | | |
| 1 | Nitrogen | 300 | 60 | 3.44 | 10 |
| 2 | Nitrogen | 300 | 60 | 3.71 | 10 |
| 3 | Nitrogen | 300 | 60 | 4.55 | 10 |
| 4 | Nitrogen | 300 | 60 | 9.05 | 10 |
| 5* | Nitrogen | 300 | 60 | 42.2 | 2 |
| 6* | Nitrogen | 300 | 60 | 181 | 10 |
| 7* | Nitrogen | 300 | 60 | 110 | 0 |
| 8* | Nitrogen | 300 | 60 | 490 | 0 |

Note:
Samples marked with "*" in Table are comparative examples.

As understood from the above results, the samples 1 to 3 as Examples have provided electroconductive films having extremely low specific resistances, respectively, less than 5 μΩ·cm which is about 3 times that of bulk copper, and having excellent close contact properties with a glass substrate, by conducting heating and calcining at 300° C. for 60 minutes in an inert atmosphere. Further, the sample 4 has provided an electroconductive film having a specific resistance which is only slightly higher than those of the samples 1 to 3 and which is thus regarded as being sufficiently low, while achieving an excellent close contact property with the substrate.

In turn, the samples 5 to 8 as Comparative Examples have provided electroconductive films having high specific resistances, respectively, and having inferior close contact properties with the substrate except for the sample 6, because these samples of Comparative Examples have not adopted the compound having two or more COOH groups and one or more OH groups where the number of COOH groups is equal to or greater than the number of OH groups, as an additive though these samples have been calcined under the same conditions as the samples 1 to 4 of Examples.

Example 5

10 parts by weight of a copper fine powder having an averaged particle size of 50 nm prepared by a wet reducing method was mixed with 90 parts by weight of a copper powder (HXR-Cu produced by Nippon Atomize Metal Powders Corporation) having an averaged particle size of 2.8 μm, thereby preparing a mixed copper powder. Added to 100 parts by weight of this mixed copper powder was 13 parts by weight of ethylene glycol as a solvent and 7 parts by weight of citric acid as an additive, thereby preparing an electroconductive composition of a sample 9 in the same manner as Example 1.

This electroconductive composition was coated onto a slide glass substrate in the same manner as Example 1, and heated and fired at 180° C. for 30 minutes in the atmospheric air in a reflow oven. The obtained electroconductive film of the sample 9 was evaluated in the same manner as Example 1, and as a result thereof, it had a volume resistivity of 27.0 μΩ·cm and a close contact property of 10 points in JIS evaluation score.

The electroconductive composition of the sample 9 was also coated onto a slide glass substrate in the same manner as Example 1, and heated and calcined at 190° C. for 20 minutes in the atmospheric air in a reflow oven. The obtained electroconductive film of a sample 10 was evaluated in the same manner as Example 1, and as a result thereof, it had a volume resistivity of 29.7 μΩ·cm and a close contact property of 10 points in JIS evaluation score.

Example 6

There was prepared an electroconductive composition of a sample 11 in the same manner as Example 5, except that the copper powder was changed to a powder of flat particles (Cu-HWF-6 produced by FUKUDA METAL FOIL POWDER Co., Ltd.) having an averaged particle size of 6.2 μm. This electroconductive composition was coated onto a slide glass substrate in the same manner as Example 5, and heated and fired at 180° C. for 30 minutes in the atmospheric air in a reflow oven to obtain an electroconductive film. The obtained electroconductive film of the sample 11 was evaluated in the same manner as Example 1, and as a result thereof, it had a volume resistivity of 30.6 μΩ·cm and a close contact property of 10 points in JIS evaluation score.

Further, the glass substrate coated with the electroconductive composition of the sample 11 was heated and fired at 190° C. for 20 minutes in the atmospheric air in a reflow oven to obtain an electroconductive film of a sample 12. The obtained electroconductive film of the sample 12 was evaluated in the same manner as Example 1, and as a result thereof, it had a volume resistivity of 32.6 μΩ·cm and a close contact property of 10 points in JIS evaluation score.

In Examples 5 and 6, it is understood that the obtained electroconductive films of the samples 9 to 12 have specific resistances much lower than 100 μΩ·cm which is about 60 times that of bulk copper even by calcining below 200° C., and exhibit excellent close contact properties with a glass substrate, respectively.

Example 7

17 parts by weight of a copper powder (HXR-Cu produced by Nippon Atomize Metal Powders Corporation) having an averaged particle size of 2.8 μm, 59 parts by weight of a copper powder (UCP030 produced by SUMITOMO METAL MINING CO., LTD.) having an averaged particle size of 0.4 μm, and 9 parts by weight of a copper powder of flat particles (Cu-HWF-6 produced by FUKUDA METAL FOIL POWDER Co., Ltd.) having an averaged particle size of 6.2 μm, were mixed with 15 parts by weight of a copper fine powder having an averaged particle size of 50 nm prepared by a wet reducing method.

17 parts by weight of ethylene glycol as a solvent and 7 parts by weight of citric acid as an additive were added to 100 parts by weight of the obtained metal powder, followed by mixing to prepare an electroconductive composition of a sample 13. This electroconductive composition was coated onto a slide glass substrate in the same manner as Example 1, and heated and calcined at 300° C. for 10 minutes in a nitrogen atmosphere in a reflow oven.

The obtained electroconductive film of the sample 13 was evaluated in the same manner as Example 1, and as a result thereof, it had a volume resistivity of 5.21 μΩ·cm and a close contact property of 10 points in JIS evaluation score. It is understood that the electroconductive film of the sample 13 has a specific resistance which is slightly high but still within an excellent range because the heating and calcining in Example 7 was so short as 10 minutes, and that the electroconductive film is also excellent in close contact property with a glass substrate.

Example 8

There was prepared an electroconductive composition of a sample 14 in the same manner as Example 2 except that the solvent was changed to 15 parts by weight of diethylene glycol, and there was formed an electroconductive film of the electroconductive composition on a slide glass substrate. The obtained electroconductive film of the sample 14 was evaluated in the same manner as Example 1, and as a result thereof, it had a volume resistivity of 5.00 μΩ·cm and a close contact property of 10 points in JIS evaluation score.

There was further prepared an electroconductive composition of a sample 15 in the same manner as Example 2 except that the solvent was changed to 15 parts by weight of glycerin, and there was formed an electroconductive film of the electroconductive composition on a slide glass substrate. The obtained electroconductive film of the sample 15 was evaluated in the same manner as Example 1, and as a result thereof, it had a volume resistivity of 3.53 μΩ·cm and a close contact property of 10 points in JIS evaluation score.

According to Example 8, by heating and calcining at 300° C. for 60 minutes in an inert atmosphere of nitrogen, the obtained electroconductive films of the samples 14 and 15 had extremely low specific resistances which are equal to or less than 5 μΩ·cm which is about 3 times that of bulk copper, and were also excellent in close contact property with a glass substrate.

What is claimed is:

1. An electroconductive composition including a metal powder, a solvent, and an additive;
   wherein the metal powder is a mixture of a copper powder having an averaged particle size between 0.3 and 20 µm and a copper fine powder having an averaged particle size between 1 and 50 nm;
   wherein the solvent is a multivalent alcohol having two or more OH groups; and
   wherein the additive is a compound having two or more COOH groups and one or more OH groups where the number of COOH groups is equal to or greater than the number of OH groups, and wherein said additive is mixed at a ratio of 1 to 15 parts by weight with 100 parts by weight of the metal powder.

2. The electroconductive composition of claim 1, wherein the metal powder is a mixture at a ratio of 1 to 100 parts by weight of the copper fine powder relative to 100 parts by weight of the copper powder.

3. The electroconductive composition of claim 1, wherein the solvent is mixed at a ratio of 5 to 35 parts by weight with 100 parts by weight of the metal powder.

4. The electroconductive composition of claim 1, wherein the solvent comprises at least one kind selected from ethylene glycol, diethylene glycol, triethylene glycol, tetraethylene glycol, and glycerin.

5. The electroconductive composition of claim 1, wherein the additive comprises at least one kind selected from malic acid, citric acid, and tartaric acid.

6. The electroconductive composition of claim 1, further including a polar solvent, together with the metal powder, solvent, and additive.

7. An electroconductive composition consisting of a metal powder, a solvent, and an additive;
   wherein the metal powder is a mixture of a copper powder having an averaged particle size between 0.3 and 20 µm and a copper fine powder having an averaged particle size between 1 and 50 nm;
   wherein the solvent is a multivalent alcohol having two or more OH groups; and
   wherein the additive is a compound having two or more COOH groups and one or more OH groups where the number of COOH groups is equal to or greater than the number of OH groups.

8. A method for forming an electro-conductive film, comprising the steps of:
   coating the electroconductive composition of claim 1 onto a substrate; and
   heat treating the electroconductive composition.

9. The method for forming the electroconductive film of claim 8, wherein the heat treating step comprises the step of:
   heating and calcining the electroconductive composition at a temperature between 200 and 300° C. in an inert atmosphere.

10. The method for forming the electroconductive film of claim 8, wherein the heat treating step comprises the step of:
    heating and calcining the electroconductive composition at a temperature between 150 and 200° C. in the atmospheric air.

* * * * *